(12) United States Patent
Shim et al.

(10) Patent No.: US 11,088,238 B2
(45) Date of Patent: Aug. 10, 2021

(54) DISPLAY DEVICE

(71) Applicant: LG Display Co., Ltd., Seoul (KR)

(72) Inventors: Woo-Sung Shim, Paju-si (KR);
Hyun-Soo Lim, Paju-si (KR);
Dong-Geun Bae, Paju-si (KR);
Young-Kyun Kim, Paju-si (KR);
Jeong-Hwan Park, Paju-si (KR);
Chang-Heon Kang, Paju-si (KR);
Kyeong-Taek Min, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 40 days.

(21) Appl. No.: 16/516,002

(22) Filed: Jul. 18, 2019

(65) Prior Publication Data

US 2020/0212158 A1 Jul. 2, 2020

(30) Foreign Application Priority Data

Dec. 27, 2018 (KR) .................. 10-2018-0170858

(51) Int. Cl.
*H01L 27/32* (2006.01)
(52) U.S. Cl.
CPC .. *H01L 27/3276* (2013.01); *H01L 2251/5392* (2013.01)

(58) Field of Classification Search
CPC ......... H01L 27/3276; H01L 2251/5392; H01L 27/32; G09G 3/006; G09G 3/3208
See application file for complete search history.

(56) References Cited

U.S. PATENT DOCUMENTS

| | | | |
|---|---|---|---|
| 9,741,278 B2 | 8/2017 | Kang et al. | |
| 2006/0001792 A1* | 1/2006 | Choi | H01L 27/3223 349/54 |
| 2016/0321972 A1 | 11/2016 | Kang et al. | |
| 2018/0158894 A1* | 6/2018 | Park | H01L 51/5253 |
| 2018/0174505 A1* | 6/2018 | Mandlik | G09G 3/3677 |

FOREIGN PATENT DOCUMENTS

KR 10-2016-0130069 A 11/2016

\* cited by examiner

*Primary Examiner* — Julia Slutsker
(74) *Attorney, Agent, or Firm* — Fenwick & West LLP

(57) ABSTRACT

A display device includes a plurality of electrode pads which are arranged in a non-display region having a side line of a substrate; a circuit film which includes a plurality of output pads contacting the plurality of electrode pads and extending in a direction, and on which a driving IC is mounted; a plurality of test lines that extend in the direction from the side line; and a plurality of connection lines which connect the plurality of test lines to corresponding electrode pads, wherein each test line is located in a separate region between two output pads adjacent to both sides of each test line.

5 Claims, 7 Drawing Sheets

DISPLAY DEVICE

CROSS REFERENCE TO RELATED APPLICATIONS

The present application claims the priority benefit of Republic of Korea Patent Application No. 10-2018-0170858 filed in Republic of Korea on Dec. 27, 2018, which is hereby incorporated by reference in its entirety.

BACKGROUND

Field of the Disclosure

The present disclosure relates to a display device.

Discussion of the Related Art

With the advancement of an information society, needs for display devices have increased. Recently, flat display devices, such as a liquid crystal display device (LCD), a plasma display panel device (PDP), and an organic light emitting diode (OLED) display device, are used.

Among the flat display devices, OLED display devices have been greatly spotlighted because the OLED display devices have advantages of compact size, light weight, thin profile, low-power driving.

The OLED display device may include an OLED panel, and a COF (chip on film) type driving circuit. In the COF type circuit, a circuit film which a driving IC is mounted on is attached to a side of the OLED panel.

In the OLED panel, a test line which extends inwardly from a test pad is formed for an auto probe test process. In the test process, a test signal applied to the test pad is transferred to an electrode pad of an array substrate via the test line.

A circuit film which a driving IC for a test process is mounted on is attached to the OLED panel, and an output pad of the circuit film outputting a driving signal contacts a corresponding electrode pad.

In a state that the circuit film is attached to the OLED panel, at least part of test lines overlap output pads, and thus a signal coupling happens.

Accordingly, output signals, which are output from the output pads signal-coupled with the test lines, are distorted, and thus a defect of image display, such as a vertical line defect, are caused.

This problem may happen to display devices, using a COF type driving IC, other than the OLED display device.

SUMMARY

Accordingly, the present disclosure is directed to a display device that substantially obviates one or more of the problems due to limitations and disadvantages of the related art.

An advantage of the present disclosure is to provide a display device which can improve a defect in display quality by improving a coupling between test lines and output pads of a circuit film in a COF type display device.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a plurality of electrode pads which are arranged in a non-display region having a side line of a substrate; a circuit film which includes a plurality of output pads respectively contacting the plurality of electrode pads and extending in a direction, and which a driving IC is mounted on; a plurality of test lines that extend in the direction from the side line; and a plurality of connection lines which connect the plurality of test lines to corresponding electrode pads, wherein each test line is located in a separate region between two output pads respectively adjacent to both sides of each test line.

In another aspect, a display device includes: a plurality of electrode pads which are arranged in a non-display region having a side line of a substrate; a circuit film which includes a plurality of output pads respectively contacting the plurality of electrode pads and extending in a direction, and which a driving IC is mounted on; a plurality of test lines that extend in the direction from the side line; a plurality of connection lines which connect the plurality of test lines to corresponding electrode pads; and a switch which is connected between each electrode pad and its corresponding connection line, wherein the switch is in an off state when a signal is output from each output pad.

In another aspect, a display device includes: a plurality of electrode pads which are arranged in a non-display region having a side line of a substrate; a circuit film which includes a plurality of output pads respectively contacting the plurality of electrode pads and extending in a direction, and which a driving IC is mounted on; a plurality of test lines that extend in the direction from the side line; a plurality of connection lines which connect the plurality of test lines to corresponding electrode pads; and a shield electrode which is formed in the array substrate and between the plurality of test lines and the plurality of output pads.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the principles of the disclosure. In the drawings.

DETAILED DESCRIPTION

Reference will now be made in detail to exemplary embodiments, examples of which are illustrated in the accompanying drawings. The same reference numbers may be used throughout the drawings to refer to the same or like parts.

For the purpose of explanations, embodiments of the present disclosure are described with an OLED display device as a display device by way of example, but not limited to such an embodiment.

First Embodiment

Figure 1:
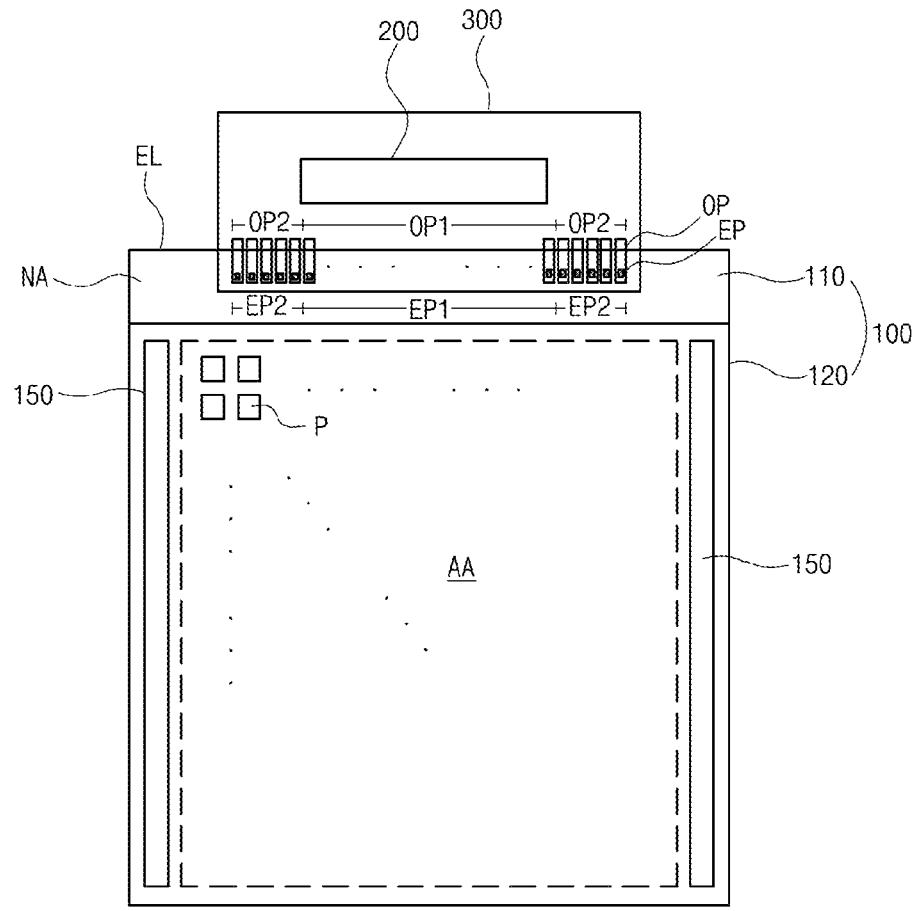
FIG. 1 is a view schematically illustrating an OLED display device according to a first embodiment of the present disclosure.

FIG. 1 is a view schematically illustrating an OLED display device according to a first embodiment of the present disclosure.

Referring to FIG. 1, the OLED display device 10 of this embodiment may be a display device using a COF type driving IC 200.

The OLED display device 10 may include a display panel 100 as an OLED panel to display images, and at least one circuit film 300 connected to a side of the display panel 100. The driving IC 200 is mounted on the circuit film 300.

In this embodiment, for the purpose of explanations, one circuit film 300 is used by way of example.

The display panel 100 may include an array substrate 110 as a first substrate, and an opposing substrate 120 as a second substrate that faces and is coupled to the array substrate 100.

In the display panel 100, a display region AA and a non-display region NA which is located outside and surrounds the display region AA are defined.

The non-display region NA, for example, an upper-side non-display region NA of the array substrate 110, which are not covered by the opposing substrate 120 and thus exposed, may be coupled to the circuit film 300 and be supplied with driving signals the circuit film 300.

The array substrate 110 includes a plurality of pixels P which are arranged in a matrix form in the display region AA. In each pixel P, array elements as driving elements to drive the pixel P may be formed.

Figure 2:
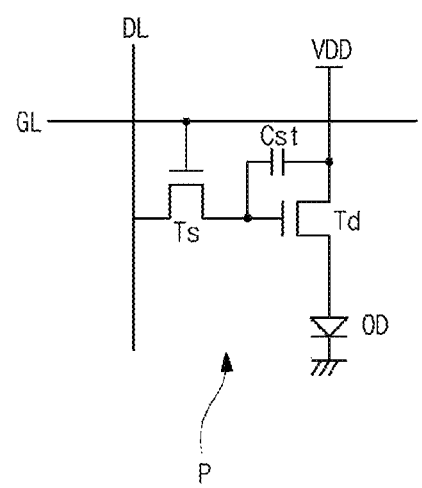
FIG. 2 is a circuit diagram schematically illustrating a pixel structure of the OLED display device according to the first embodiment of the present disclosure.

FIG. 2 is a circuit diagram schematically illustrating a pixel structure of the OLED display device according to the first embodiment of the present disclosure.

Referring to FIG. 2, each pixel P may be defined by gate and data lines GL and DL crossing each other.

In the pixel P, array elements including a switching transistor Ts, a driving transistor Td, a light emitting diode OD and a storage capacitor Cst may be formed by way of example. Additional driving element(s) such as other transistor(s) and/or capacitor(s) may be formed in the pixel P.

The switching transistor Ts is connected to the corresponding gate and data lines GL and DL. When a gate signal is applied to the gate line GL, the switching transistor Ts are turned on, and a data signal transferred through the data line DL is applied to the driving transistor Td.

When a gate of the driving transistor Td is supplied with the data signal, the driving transistor Td is turned on, and a current corresponding to the supplied data signal flows from a high power voltage (VDD) terminal to the light emitting diode OD, and thus the light emitting diode OD emits a light.

The storage capacitor Cst serves to store the data signal applied to the gate of the driving transistor Td.

In the non-display region NA of the array substrate 110, a plurality of electrode pads EP receiving driving signals output from the driving IC 200 may be formed.

The circuit film 300 having the driving IC 200 is attached to the non-display region NA where the electrode pads EP are located. Accordingly, a plurality of output pads OP formed at a bottom surface of the circuit film 300 may contact (or be coupled to) the corresponding electrode pads EP.

An intermediate contacting means such as an ACF (anisotropic conductive film) may be interposed between the circuit film 300 and the display panel 100 to connect the output pads OP and the electrode pads EP.

By the connection of the output pads OP and the corresponding electrode pads EP, the driving signals from the output pads OP are applied to the electrode pads EP. The driving signals applied to the electrode pads EP are transferred to the inside of the array substrate 110 through signal lines which are formed in the array substrate 110 and contact the electrode pads EP.

In the non-display region NA of the array substrate 110, a gate driving circuit 150 to drive the gate lines GL may be formed in a GIP (gate-in panel) type. The GIP type gate driving circuit 150 may be formed directly in the non-display region NA while forming the driving elements in the pixel P. In view of stable operation of the display panel 100, GIP type gate driving circuits 150 may be respectively formed at opposing sides of the display region AA, for example, left and right sides of the display region AA.

Alternatively, the gate driving circuit 150 may be formed in an IC. In this case, the gate driving circuit 150 may be configured in a COG (chip on glass) type to be mounted on the array substrate 110, or may be configured in a COF type to be connected to the array substrate 110. Alternatively, the gate driving circuit 150 may be configured to be integrated into the driving IC 200.

The plurality of electrode pads EP may include a plurality of first electrode pads EP1, and a plurality of second electrode pads EP2. The first electrode pads EP1 may receive data signals (or image signals), and the second electrode pads EP2 may receive driving control signals and power voltages to operate the display panel 100. The first electrode pads EP1 supplied with the data signals may transfer the data signals to the corresponding data lines DL connected thereto.

The second electrode pads EP2 supplied with the driving control signals and the power voltages may transfer the driving control signals and the power voltages to corresponding signal lines connected thereto.

The first electrode pads EP1 may be located in a first region as a relatively inner region, and the second electrode pads EP2 may be located in a second region as a region outside the first region.

In a case that the gate driving circuits 150 are located at the opposing sides of the display region AA, the second regions may be defined respectively at both sides (or opposing sides) of the first region, and the second electrode pads EP2 may be arranged symmetrically at the both sides of the first region.

The output pads OP of the circuit film 300, which are coupled to the corresponding electrode pads EP, may be configured in a similar way to the configuration of the electrode pads EP. For example, the plurality of output pads OP includes a plurality of first output pads OP1 outputting the data signals, and a plurality of second output pads OP2 outputting the driving control signals and the power voltages.

In the array substrate 110, test lines which serve to transfer test signals to the electrode pads EP in an auto probe test process, and connection lines which connect the test lines with the electrode pads EP may be formed.

The OLED display device 10 may be configured such that the test lines and the output pads OP of the circuit film 300 are arranged not to overlap each other and a signal coupling (or electrical coupling or capacitive coupling) therebetween due to the overlapping are be prevented.

Accordingly, abnormal driving signals caused by the signal coupling can be prevented from being applied from the output pads OP to the electrode pads EP, and thus a defect in display quality such as a vertical line defect can be improved.

A structure to prevent the signal coupling between the test line and the output pad in this embodiment is explained in detail below.

Figure 3:
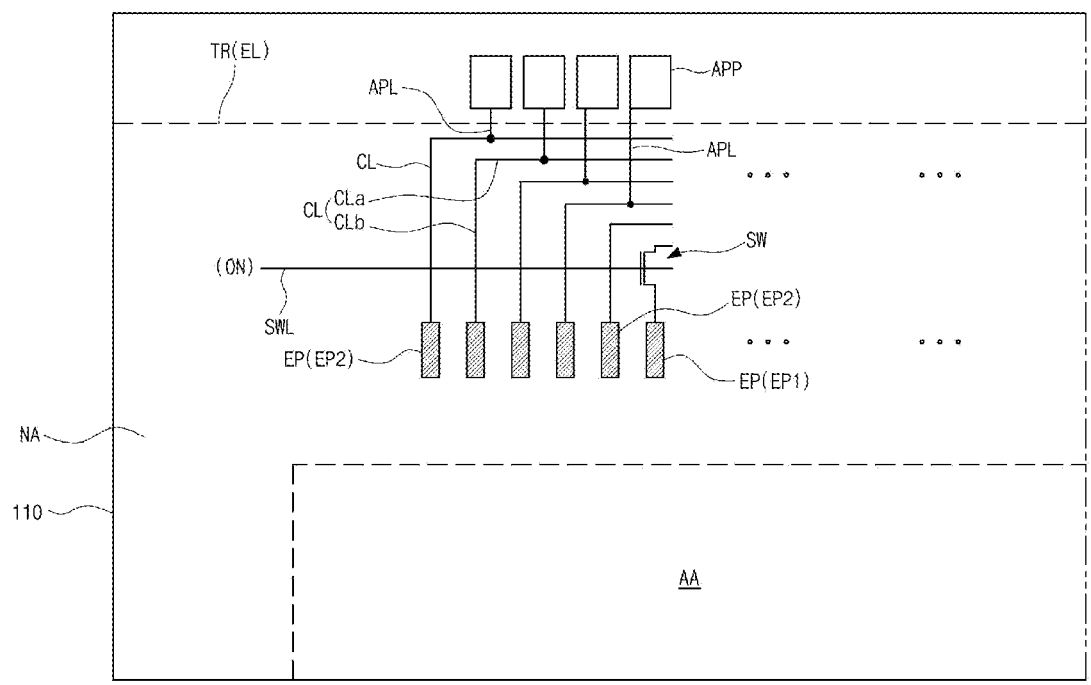
FIG. 3 is a view schematically illustrating a portion of a non-display region of an array substrate of a display panel in a test process according to the first embodiment of the present disclosure.

FIG. 3 is a view schematically illustrating a portion of a non-display region of an array substrate of a display panel in a test process according to the first embodiment of the present disclosure.

When processes of manufacturing the display panel 100 are finished, a test process using an auto probe is conducted. FIG. 3 shows a structure of the array substrate 110 of the display panel 100 in the test process.

Referring to FIG. 3, in an upper peripheral portion as the non-display region NA of the array substrate 110, which the circuit film 300 is attached to after the test process, the plurality of electrode pads EP may be arranged along a first direction, for example, a horizontal direction.

The plurality of electrode pads EP may include the plurality of first electrode pads EP1 to receive data signals, and the plurality of second electrode pads EP2 to receive control signals and power voltages.

A plurality of test pads APP which receive test signals in the test process may be formed near an upper side line (or upper side edge) of the array substrate 110. The test pads APP may be arranged along the first direction which is parallel with the upper side edge.

The test pads APP contact respective test pins of an auto probe test apparatus and are supplied with test signals output from the test pins in the test process.

The plurality of test pads APP may include a plurality of first test pads which receive test data signals and are connected to corresponding first electrode pads EP1, and a plurality of second test pads which receive test control signals and test power voltages and are connected to corresponding second electrode pads EP2.

In order to connect the test pad APP to the corresponding electrode pad EP, test lines APL and connection lines CL may be formed in a region between a region where the test pads APP are formed and a region where the electrode pads EP are formed.

The plurality of test lines APL may be connected to the plurality of test pads APP, respectively, and may extend inside the array substrate 110 i.e., toward the display region AA. For example, the test line APL may extend downwardly in the second direction, which is perpendicular to the upper side line of the array substrate 110.

The test line APL may be connected to the corresponding connection line CL and be electrically connected to the corresponding electrode pad EP.

The connection line CL to connect the test line APL to the electrode pad EP may include a first portion CLa and a second portion CLb. The first portion CLa may be connected to the test line APL and extend in the first direction. The second portion CLb may be connected to the first portion CLa at one end of the second portion CLb, extend downwardly in the second direction, and be connected to the electrode pad EP at the other end of the second portion CLb.

A switch SW may be connected to the connection line CL which corresponds to the first electrode pad EP1 connected to the data line DL and supplied with the test data signal. In other words, the switch SW may be connected between the first electrode pad EP1 and its corresponding connection line CL.

In the test process, the switch SW may be turned on (or enabled) to make an electrical connection between the connection line CL to the first electrode pad EP1, and the test data signal may be transferred to the first electrode pad EP1.

After the test process is finished, the switch SW is turned off (or disabled) to make an electrical disconnection between the connection line CL to the first electrode pad EP1.

In order to turn on/off the switch SW, a switch control line SWL which is connected to the switch SW and transfers a switching signal may be formed to extend in the first direction.

A connection line CL connected to an electrode pad EP which is at a relatively outer position may be formed at an outer position than a connection line CL connected to an electrode pad EP which is at a relatively inner position.

Further, a test pad APP connected to a connection line CL which is at a relatively outer position may be formed at an outer position than a test pad APP connected to a connection line CL which is at a relatively inner position.

Further, a test line APL which is at a relatively inner position may be formed to traverse (or cross) a connection line CL connected to a test line APL which is at an outer portion than the inner test line APL.

Further, an electrode pad EP and a test line APL connected thereto may be formed at different positions on the first direction. In other words, on a horizontal axis of the first direction, an electrode pad EP and a test line APL corresponding to each other may be located at different horizontal coordinate values. For example, an electrode pad EP may be at an outer position than a test line APL connected to the electrode pad EP.

In this embodiment, with respect to the horizontal axis, each test line APL may be arranged to correspond to a separate region between two neighboring electrode pads EP which are located near both sides of each test line APL.

Accordingly, each test line APL may be arranged between a separate region between two neighboring output pads OP of the circuit film 300 after the test process. This arrangement will be explained in detail later.

For the above-configured array substrate 110, in the test process, a test signal is applied to the test pads APP and then transferred to its corresponding electrode pad EP through the test line APL and the connection line CL which are connected to the test pad APP. In this process, a turn-on signal (or enable signal) is applied to the switch control line SWL, thus the switch SW is turned on, and thus the test data signal is transferred to the first electrode pad EP1 through the switch SW.

As test signals are transferred to the electrode pads EP, the test process for the display panel 100 is conducted.

After the test process is finished, a trimming process is conducted to separate each test line APL. In the trimming process, a laser may be irradiated along a trimming line TR which is defined to traverse the test lines APL in the first direction, and thus all the test lines APL may be physically separated.

Accordingly, the test pads APP and the corresponding connection lines CL may be physically separated and disconnected.

After the trimming process, a portion outside the trimming line TR i.e., a portion, including the test pads APP, of the non-display region NA of the array substrate 110 are physically removed.

Accordingly, the test pads APP is removed from the display panel 100, and a portion inside the trimming portion remains. After the trimming process is finished, the trimming line TR may become an upper side line EL, the test lines APL and the connection lines CL connected thereto positioned inside the trimming line TR remain in the array substrate 110.

The circuit film 300 having the driving IC 200 mounted thereon is attached to the display panel 100 so that manufacturing the OLED display device 10 is finished, and in this state, the OLED display device 10 is operated to display images.

Figure 4:
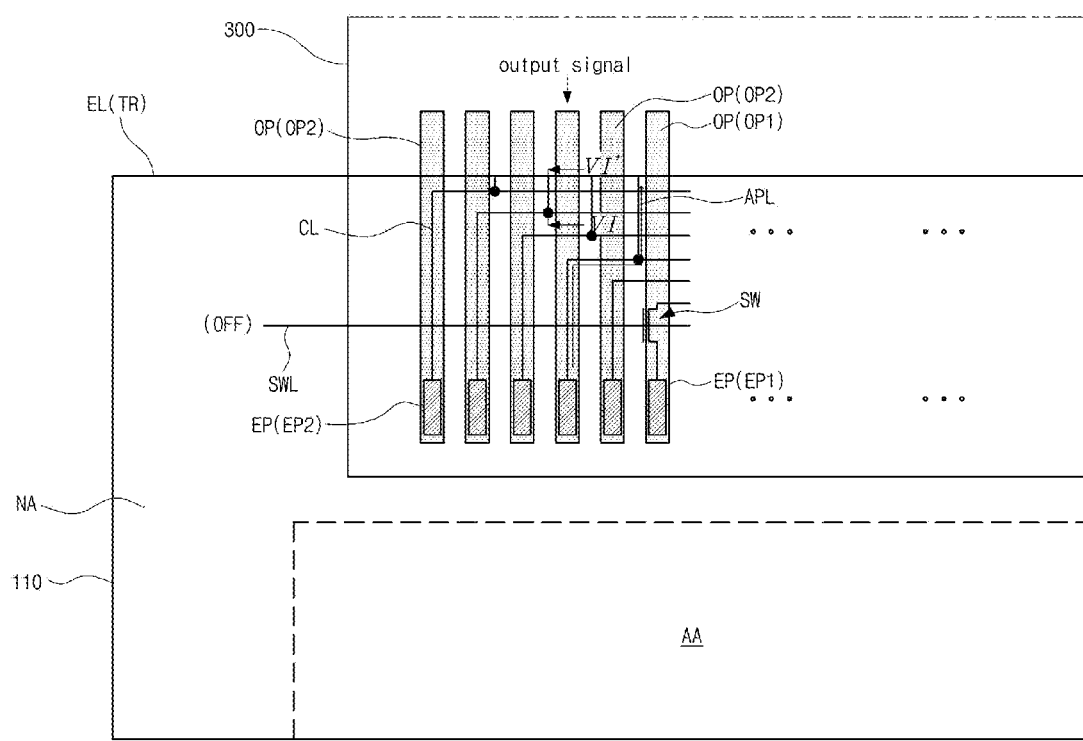
FIG. 4 is a view schematically illustrating an array substrate of a display panel and a circuit film attached thereto after a test process according to the first embodiment of the present disclosure.

FIG. 4 is a view schematically illustrating an array substrate of a display panel and a circuit film attached thereto after a test process according to the first embodiment of the present disclosure.

Referring to FIG. 4, the plurality of output pads OP are formed in the circuit film 300, and each output pad OP contacts the corresponding electrode pad EP of the array substrate 110.

The plurality of output pads OP may each be formed to extend in the second direction perpendicular to the first direction that is an extension direction of the upper side line EL of the array substrate 110 i.e., to extend in an extension direction of the test line APL, and the plurality of output pads OP may be arranged along the first direction.

The output pad OP contacting the electrode pad EP may be formed to cover at least the electrode pad EP and a portion between the electrode pad EP and the upper side line EL of the array substrate 110. In other words, a length of an extension direction of the output pad OP may be equal to or greater than a sum of a length of the electrode pad EP and a length between the electrode pad EP and the upper side line EL.

In a state that the output pad OP and the electrode pad EP contact each other, it may be preferable that all the test lines APL remaining at the array substrate 110 may non-overlap the output pads OP and be arranged at separate regions between the output pads OP.

In other words, each test line APL may be configured such that each test line APL is located in a separate region between two neighboring electrode pads EP, which are located adjacent to both sides of each test line APL, and does not overlap the two neighboring electrode pads EP.

Because of the non-overlapping arrangement between the test lines APL and the output pads OP, a signal coupling therebetween can be prevented.

Figure 5:
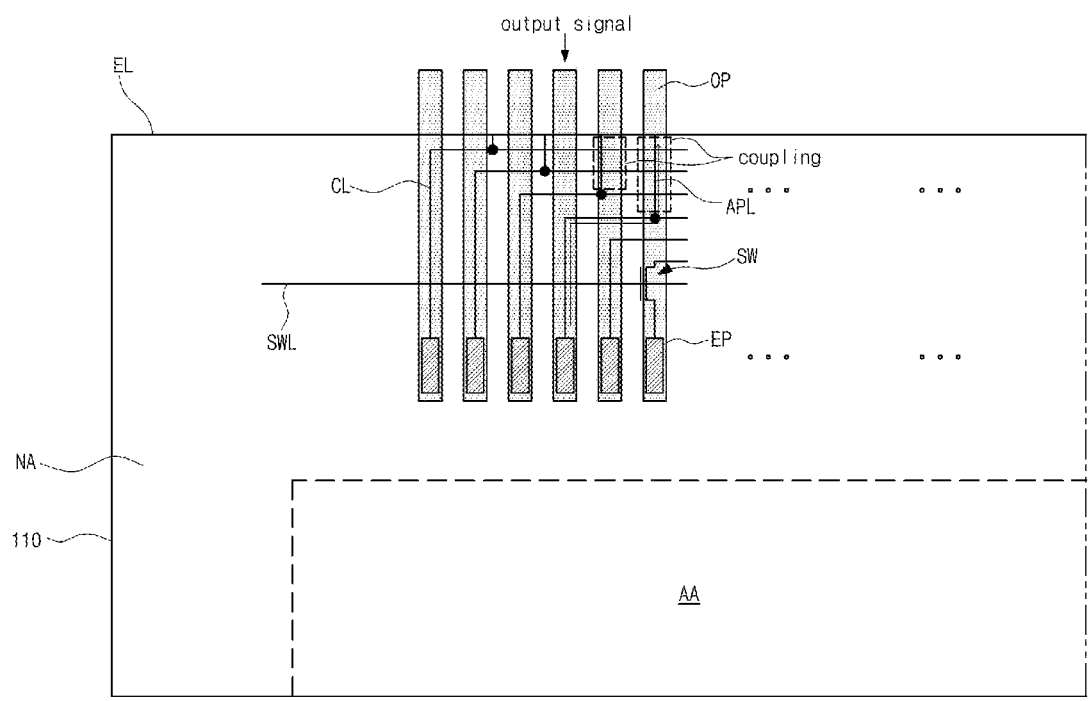
FIG. 5 is a view schematically illustrating an OLED display device as a comparative example in which an output pad and a test line overlap each other and a signal coupling happens.

This is explained further with reference to FIG. 5 which is a view schematically illustrating an OLED display device as a comparative example in which an output pad OP and a test line APL overlap each other and a signal coupling happens.

In each of FIGS. 4 and 5, it is assumed that a fourth output pad OP from the left is referred to as an output pad A, and a sixth output pad OP from the left is referred to as an output pad B. Further, it is assumed that electrode pads EP respectively connected to the output pads A and B are respectively referred to as electrode pads A and B. Further, it is assumed that a test line APL connected to the electrode pad A is referred to a test line A.

In this case, in the display device of FIG. 5 having a structure that the test line A overlaps the output pad B, a signal coupling between the test line A and the output pad B happens.

In this regard, an output signal A output from the output pad A to the electrode pad A is applied to the corresponding test line A. However, the test line A overlaps the output pad B collinearly which is connected to the electrode pad B not corresponding to the test line A and which outputs an output signal B. In this case, by the coupling between the test line A and the output pad B, the output signal A of the test line A affects the output signal B of the output pad B, and due to this signal coupling, the output signal B of the output pad B is distorted and the abnormal output signal B is finally applied to the electrode pad B.

Accordingly, the abnormal output signal B applied to the electrode pad B is transferred to the pixels P in the display region AA through the corresponding signal line i.e., the corresponding data line DL. Thus, a vertical line defect happens that a smear along the vertical direction as the second direction is seen.

Similarly, as shown in FIG. 5, an output pad on the left of the output pad B (i.e., a fifth output pad from the left) overlaps a test line on the left of the test line A (i.e., a test line connected to a third output pad from the left) to cause a signal coupling therebetween, and thus applies an abnormal output signal to a corresponding output pad.

To the contrary, the OLED display device 10 of FIG. 4 in this embodiment is configured to have a structure of the non-overlapping between the test lines APL and the output pads OP.

Accordingly, a signal coupling between the test line A and the output pad B is prevented, thus the output signal A of the test line A does not affect the output signal B of the output pad B, and thus the output signal B of the output pad B can't be distorted and can be normally applied to the electrode pad B.

Accordingly, the normal output signal B is transferred to the corresponding pixels P in the display region AA, and thus a vertical line defect due to a coupling can be improved.

Similarly, an output pad on the left of the output pad B (i.e., a fifth output pad from the left) does not overlap a test line on the left of the test line A (i.e., a test line connected to a third output pad on the left) not to cause a signal coupling therebetween, and thus applies an normal output signal to a corresponding output pad.

In this embodiment, the connection lines CL may be formed with a metal layer that is a relatively lower layer in a stacked structure of the array substrate 110. For example, the connection lines CL may be formed at the same layer and of the same material as the gate line GL.

Each test line APL may include at least a portion that is formed at the same layer and of the same material as the connection line CL.

For example, the test line APL which is connected to the outermost connection line CL may be formed at the same layer and of the same material as the connection line CL, and this test line APL may form an integral structure with the outermost connection line CL.

At least one of the test lines APL which are connected to the connection lines CL located inside the outermost connection line CL may include a jumping pattern formed at a crossing portion with other connection line CL, which is not connected to (or not correspond to) the at least one of the test lines APL, in order to prevent an electrical short-circuit with the other connection line CL.

Figure 6:
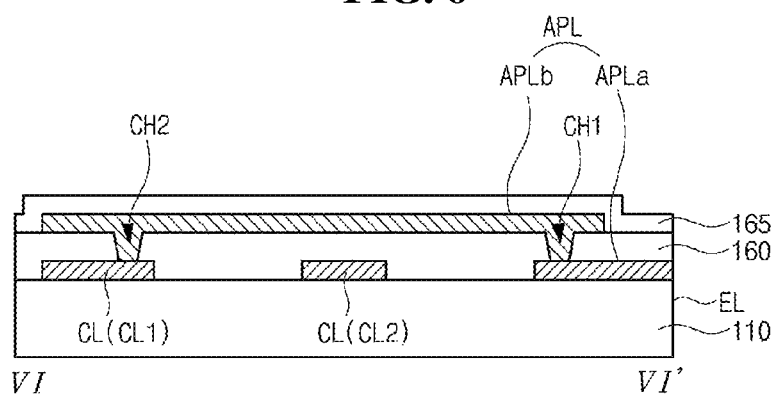
FIG. 6 is a cross-sectional view taken along a line VI-VI' of FIG. 4 according to the first embodiment of the present disclosure.

This refers to FIG. 6, which is a cross-sectional view taken along a line VI-VI' of FIG. 4.

For the purposed of explanations, in FIG. 6, a connection line CL connected to a test line APL is indicated as a connection line CL1, and other connection line CL not connected to the test line APL is indicated as other connection line CL2.

The test line APL crossing the other connection line CL2 may include a first portion APLa which extends inwardly from the upper side line EL, and a second portion APLb which contacts an end of the first portion APLa, is located on the other connection line CL2 and extends across the other connection line CL2, and is connected to the corresponding connection line CL.

The connection line CL may be formed with a first metal layer on the array substrate 110, for example, may be formed at the same layer and of the same material as the gate line GL.

The first portion APLa may be formed at the same layer and of the same material as the connection line CL.

The second portion APLb serves as a jumping pattern to connect the corresponding connection line CL and the first portion APLa, and may be formed on an insulating layer 160 which is located on the connection line CL. The second portion APLb may be formed with a second metal layer, for example, may be formed at the same layer and of the same material as the data line DL.

One end of the second portion APLb may contact the first portion APLa through a first contact hole CH1 which is formed in the insulating layer 160, and the other end of the second portion APLb may contact the connection line CL through a second contact hole CH2 which is formed in the insulating layer 160.

A passivation layer 165 made of an insulating material may be formed on the second portion APLb.

In the case that the test line APL is configured to include the second portion APLb as the jumping pattern, if the second portion APLb located at a relatively upper layer overlaps the output pad OP of the circuit film 300, a coupling with the output pad OP by the jumping pattern increases.

However, in this embodiment, the test line APL is configured with a structure of non-overlapping the output pad OP, and thus the increase of a coupling with the output pad OP by the jumping pattern can be effectively prevented.

Second Embodiment

Figure 7:
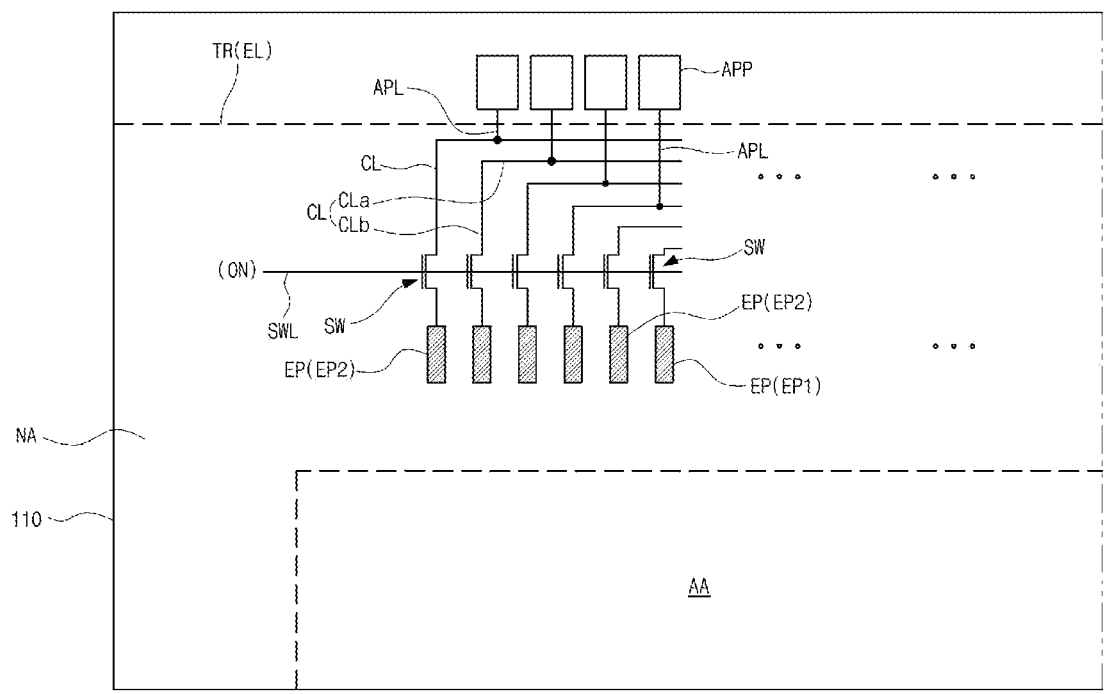
FIG. 7 is a view schematically illustrating a portion of a non-display region of an array substrate of a display panel in a test process according to a second embodiment of the present disclosure.
Figure 8:
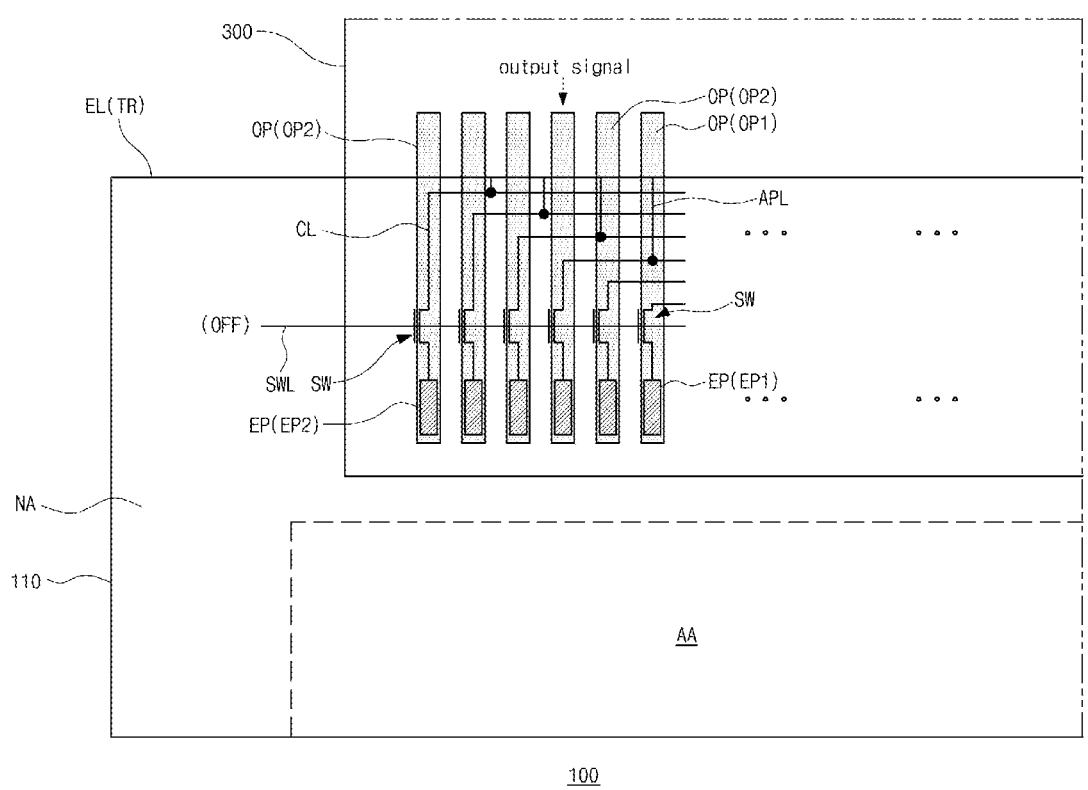
FIG. 8 is a view schematically illustrating an array substrate of a display panel and a circuit film attached thereto after a test process according to the second embodiment of the present disclosure.

FIG. 7 is a view schematically illustrating a portion of a non-display region of an array substrate of a display panel in a test process according to a second embodiment of the present disclosure. FIG. 8 is a view schematically illustrating an array substrate of a display panel and a circuit film attached thereto after a test process according to a second embodiment of the present disclosure.

Explanations of the same or like parts of the first embodiment may be omitted.

In order to prevent a signal coupling between an output pad OP and a test line APL, the OLED display device of this embodiment may be configured such that each electrode pad EP and its corresponding test line APL is electrically disconnected (or electrically open-circuited) after the test process. Accordingly, the test line APL after the test process is in an electrical floating state, and thus even though the test line APL and the output pad OP overlap each other, a signal coupling therebetween can be prevented.

To do this, in the array substrate 110, a switch SW, which is connected to each electrode pad EP at an test signal input side of each electrode pad EP, may be formed.

This is explained in detail with reference to FIGS. 7 and 8.

Referring to FIG. 7, in a test process, in a non-display region NA of an array substrate 110 of a display panel 100, a plurality of electrode pads EP may be arranged along a first direction, for example, a horizontal direction.

The plurality of electrode pads EP may include a plurality of first electrode pads EP1 to receive data signals, and a plurality of second electrode pads EP2 to receive control signals and power voltages.

A plurality of test pads APP which receive test signals in the test process may be formed near an upper side line of the array substrate 110.

The plurality of test pads APP may include a plurality of first test pads which receive test data signals and are connected to corresponding first electrode pads EP1, and a plurality of second test pads which receive test control signals and test power voltages and are connected to corresponding second electrode pads EP2.

In order to connect the test pad APP to the corresponding electrode pad EP, test lines APL and connection lines CL may be formed in a region between a region where the test pads APP are formed and a region where the electrode pads EP are formed.

The test line APL may be connected to the corresponding connection line CL and be electrically connected to the corresponding electrode pad EP.

The connection line CL to connect the test line APL to the electrode pad EP may include a first portion CLa and a second portion CLb. The first portion CLa may be connected to the test line APL and extend in the first direction. The second portion CLb may be connected to the first portion CLa at one end of the second portion CLb, extend downwardly in the second direction, and be connected to the electrode pad EP at the other end of the second portion CLb.

The switch SW may be connected between each electrode pad EP and its corresponding second portion CLb to switch on/off an electrical connection therebetween.

In other words, like the first electrode pad EP1, the second electrode pad EP2 may be configured to be connected to the corresponding connection line CL through the switch SW.

In the test process, each switch SW may be in a turn-on state to make an electrical connection between each electrode pad EP to the corresponding connection line CL, and each test data signal may be transferred to each electrode pad EP.

After the test process is finished, each switch SW is in a turn-off state to make an electrical disconnection between the connection line CL to the electrode pad EP.

In order to turn on/off all the switches SW, a switch control line SWL which is connected to the switches SW and transfers a switching signal may be formed to extend in the first direction.

As test signals are transferred to the electrode pads EP, the test process for the display panel 100 is conducted.

After the test process is finished, a trimming process is conducted to separate each test line APL.

After the trimming process, a portion, including the test pads APP, of the non-display region NA of the array substrate 110 are physically removed.

Accordingly, the test pads APP is removed from the display panel 100, and a portion inside the trimming portion remains. After the trimming process is finished, the trimming line TR may become an upper side line EL, the test lines APL and the connection lines CL connected thereto positioned inside the trimming line TR remain in the array substrate 110.

The circuit film 300 having the driving IC 200 mounted thereon is attached to the display panel 100 so that manufacturing the OLED display device 10 is finished, and in this state, the OLED display device 10 is operated to display images.

Referring to FIG. 8, a plurality of output pads OP are formed in a circuit film 300, and each output pad OP contacts the corresponding electrode pad EP of the array substrate 110.

The plurality of output pads OP may each be formed to extend in the second direction perpendicular to the first direction that is an extension direction of the upper side line EL of the array substrate 110 i.e., to extend in an extension direction of the test line APL, and the plurality of output pads OP may be arranged along the first direction.

When the OLED display device with the circuit film 300 attached thereto is operated to display images normally, each switch SW is applied with a switching signal of a turn-off level thus is turned off.

Accordingly, each electrode pad EP and its corresponding test line APL are electrically disconnected and an electrical open-circuit therebetween is made, and thus output signals applied from the output pads OP to the electrode pads EP are not transferred to the test lines APL.

Thus, a signal coupling between the test lines APL and the output pads OP can be prevented, and a defect in display quality can be improved.

Further, in this embodiment, the test lines APL after the test process are electrically disconnected from the electrode pads EP. Thus, even though a short-circuit between the test lines APL happens in the trimming process, this does not affect the operation of the OLED display device. Thus, a limitation to a separate distance between the test lines APL can be overcome and a pitch between the test lines APL can be minimized.

The structure to prevent a signal coupling of the second embodiment may be combined with the structure to prevent a signal coupling of the first embodiment. This combination can further prevent a signal coupling, and a defect in display quality can be further improved.

Third Embodiment

Figure 9:
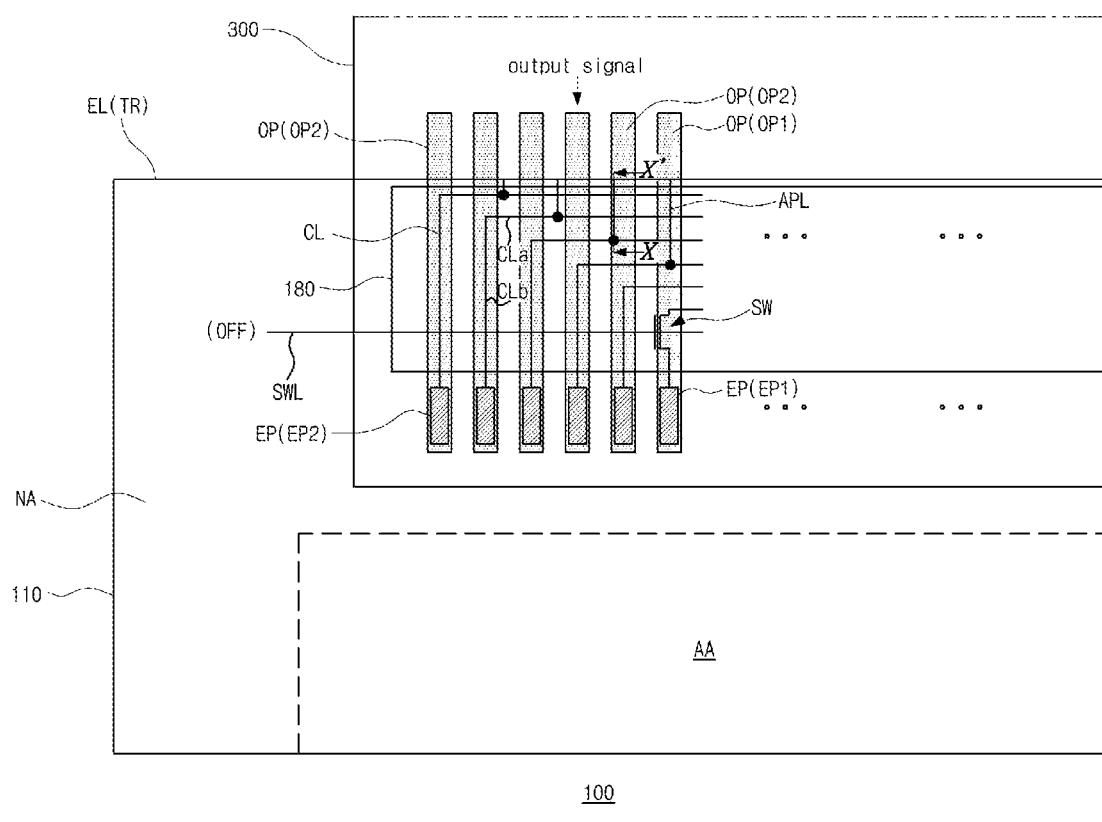
FIG. 9 is a view schematically illustrating a portion of a non-display region of an array substrate of a display panel in a test process according to a third embodiment of the present disclosure.
Figure 10:
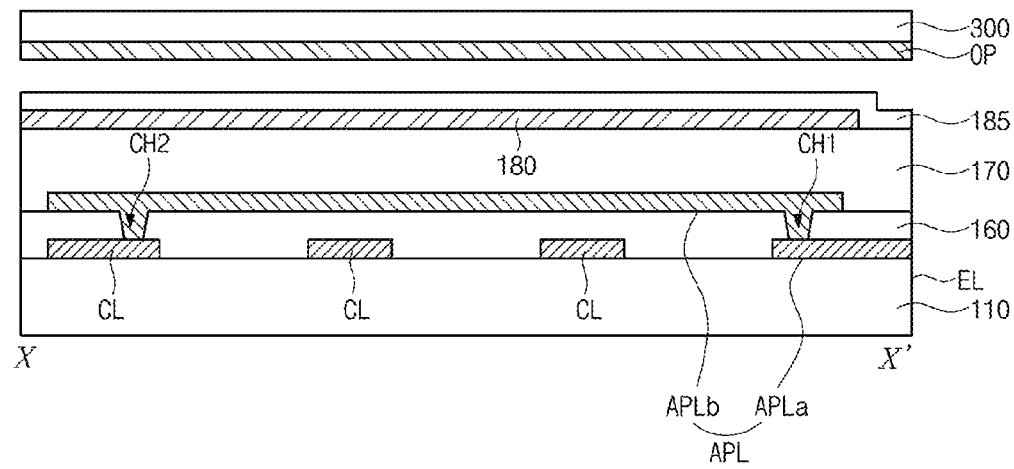
FIG. 10 is a cross-sectional view taken along a line X-X' of FIG. 9 according to the third embodiment of the present disclosure.

FIG. 9 is a view schematically illustrating a portion of a non-display region of an array substrate of a display panel in a test process according to a third embodiment of the present disclosure. FIG. 10 is a cross-sectional view taken along a line X-X' of FIG. 9.

Explanations of the same or like parts of the first and embodiments may be omitted.

In order to prevent a signal coupling between an output pad OP and a test line APL, the OLED display device of this embodiment may be configured such that a shield electrode 180, which is located between the test line APL and the output pad OP to shield an electric field therebetween is formed in the array substrate 110.

Since the shield electrode 180 is employed, a signal coupling between the test line APL and the output pad OP can be prevented.

This is explained in detail with reference to FIGS. 9 and 10.

After a test process for the display panel 100 is finished, a trimming process is conducted. Then, a circuit film 300 having a driving IC (200 of FIG. 1) mounted thereon is attached to the display panel 110.

Each output pad OP of the circuit film 300 contacts a corresponding electrode pad EP of the array substrate 110.

In the array substrate 110, the shield electrode 180 may be formed on the test lines APL.

In this regard, the shield electrode 180 may be located on an insulating layer 170, which is on the test lines APL, and be formed using a third metal layer. For example, the shield electrode 180 may be formed at the same layer and of the same material as a first electrode (or a pixel electrode) of a light emitting diode (OD of FIG. 2). The insulating layer 170 between the test line APL and the shield electrode 180 may be referred to as a second insulating layer 170, and an insulating layer 160 between the second portion APLb of the test line APL and the connection line CL may be referred to as a first insulating layer 160. A protection layer 185 may be formed on the shield electrode 180.

The shield electrode 180 may be interposed between the test lines APL and the output pads OP, and overlapped with the test lines APL and the output pads OP. As shown in FIG. 9 and FIG. 10, the shield electrode 180 may be overlapped with the test lines APL and the out pads OP. Further, the shield electrode 180 may be disposed over the test line APL, and may be disposed below the out pads OP. For example, the shield electrode 180 may be disposed between the test lines APL and the output pads OP.

The shield electrode 180 may extend in the second direction parallel with the upper side line EL of the array substrate 110, and go across the test lines APL.

The shield electrode 180 may be applied with a shield voltage, such as a ground voltage, to shield an electric field between a metal layer therebelow and a metal layer thereon.

Accordingly, even though the test line APL and the output pad OP overlap each other, a signal coupling therebetween can be minimized or prevented due to the shield electrode 180.

The test line APL, which is connected to the connection line CL located inside the outermost connection line CL, may include a first portion APLa which is formed at the same layer and of the same material as the connection line CL, and a second portion APLb which is a jumping pattern formed at a crossing portion with other connection line CL, which is not connected to this test line APL, and is formed at the same layer and of the same material as the data line (DL of FIG. 2).

Since the second portion APLb is located over the first portion APLa, the second portion APLb may significantly affect a signal coupling between the test line APL and the output pad OP.

Accordingly, it may be preferable that the shield electrode 180 has a width to cover at least the second portions APLb of the test lines APL.

For example, a longest test line APL among the test lines in the array substrate 110 may have a longest second portion APLb, and the shield electrode 180 may be preferably formed to cover the second portion APLb of the longest test line APL.

Further, the shield electrode 180 may cover the entire longest test line APL, and in this case, all the test lines APL are covered by the shield electrode 180 and thus an effect of a prevention of a signal coupling with the output pads OP can be maximized.

The shield electrode 180 may be interposed between the second portion ALPb of the test line APL and the output pad OP, and overlapped with the second portion ALPb of the test line APL and the output pads OP. As shown in FIG. 10, the shield electrode 180 may be overlapped with the second portion ALPb of the test line APL and the out pad OP. Further, the shield electrode 180 may be disposed between the second portion ALPb of the test line APL and the output pad OP.

The shield electrode 180 may extend in a downward direction to the electrode pad EP and cover at least parts of the connection lines CL. For example, the shield electrode 180 may cover the first portion CLa of the connection line CL and at least a part of the second portion CLb of the connection line CL.

Further, the shield electrode 180 may extend in the downward direction to cover the switch SW.

The structure to prevent a signal coupling of the third embodiment may be combined with the structure to prevent a signal coupling of the first and/or second embodiment(s). This combination can further prevent a signal coupling, and a defect in display quality can be further improved.

According to the above embodiments, in the COF type display device, the test line of the array substrate and the output pad of the circuit film may not overlap each other, and/or a switch is connected between each electrode pad and its corresponding test line and turned off when operating the display device, and/or the shield electrode is located between the test line and the output pad.

Accordingly, a signal coupling between the test line and the output pad can be minimized or prevented, and thus a defect in display quality caused by the signal coupling can be improved effectively.

In the above embodiments, the OLED display device is described by way of example. However, it should be understood that the above embodiments can be applied to all sorts of display devices, including an LCD, using a COF type driving IC.

In the above embodiments, the structures of the test line, the connection line, the electrode pad, the output pad and so on are described by way of example. For example, the present specification describes the structure in which the connection CL may include a first portion CLa and a second portion CLb, as shown in FIG. 3. However, it should be understood that the present disclosure is not limited to the above embodiments.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
    a plurality of electrode pads which are arranged in a first direction in a non-display region of a substrate;
    a circuit film on which a driving integrated circuit (IC) is mounted, the circuit film including a plurality of output pads extending in the first direction;
    a plurality of test lines that are arranged in the first direction and extend in a second direction perpendicular to the first direction; and
    a plurality of connection lines which connect the plurality of test lines to corresponding electrode pads,
    wherein each of the plurality of test lines is extended to an end side of the substrate so that an end portion of the test line is exposed to outside through the end side of the substrate,
    wherein the circuit film is attached to the non-display region of the substrate to contact each of the plurality of output pads of the circuit film to a corresponding electrode pad of the plurality of electrode pads, and
    wherein each of the plurality of test lines is located in a separate region between two output pads of the circuit film respectively adjacent to both sides of each test line.

2. The display device of claim 1, wherein the plurality of connection lines are formed using a first metal layer,
    wherein an insulating layer is on the plurality of connection lines,
    wherein the plurality of test lines include at least one test line which crosses connection lines other than a connection line connected to the at least one test line,
    wherein the at least one test line includes a first portion formed using the first metal layer, and a second portion which is on the insulating layer and is formed using a second metal layer, and
    wherein the second portion contacts the first portion at one end of the second portion, traverses the connection lines other than the connection line, and contacts the connection line corresponding to the at least on test line at another end of the second portion.

3. The display device of claim 1, wherein the plurality of electrode pads includes a plurality of first electrode pads receiving data signals, and a plurality of second electrode pads receiving control signals and power voltages, and
    wherein a switch is connected between each first electrode pad and a connection line corresponding to the first electrode pad.

4. The display device of claim 1, wherein each of the plurality of test lines does not overlap its adjacent output pad.

5. The display device of claim 1, further comprising a switch control line connected to a switch to transfer a switching signal.

* * * * *